US011469295B1

(12) United States Patent
Chang et al.

(10) Patent No.: US 11,469,295 B1
(45) Date of Patent: Oct. 11, 2022

(54) DECOUPLING CAPACITOR INTEGRATED IN SYSTEM ON CHIP (SOC) DEVICE

(71) Applicant: MARVELL ASIA PTE, LTD., Singapore (SG)

(72) Inventors: Runzi Chang, Saratoga, CA (US); Huahung Kao, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 184 days.

(21) Appl. No.: 16/940,727

(22) Filed: Jul. 28, 2020

Related U.S. Application Data

(60) Provisional application No. 62/879,789, filed on Jul. 29, 2019.

(51) Int. Cl.
| | | |
|---|---|---|
| *H01L 49/02* | (2006.01) | |
| *H01L 25/065* | (2006.01) | |
| *H01L 23/522* | (2006.01) | |

(52) U.S. Cl.
CPC .......... *H01L 28/87* (2013.01); *H01L 23/5223* (2013.01); *H01L 23/5226* (2013.01); *H01L 25/0652* (2013.01); *H01L 25/0657* (2013.01); *H01L 28/40* (2013.01); *H01L 28/91* (2013.01); *H01L 2224/16135* (2013.01); *H01L 2224/16145* (2013.01)

(58) Field of Classification Search
CPC ............... H01L 28/40–91; H01L 28/92; H01L 25/0652; H01L 25/0657; H01L 2224/16135; H01L 2224/16145; H01L 23/5223

See application file for complete search history.

(56) References Cited

U.S. PATENT DOCUMENTS

| | | | |
|---|---|---|---|
| 6,825,545 B2 | 11/2004 | Nasr | |
| 8,492,816 B2 * | 7/2013 | Nakos | ................... H01L 29/945 257/E21.651 |
| 10,049,890 B2 * | 8/2018 | Chou | ...................... H01L 28/75 |
| 2015/0102459 A1 * | 4/2015 | Lai | ........................... H01L 22/34 257/532 |
| 2020/0035779 A1 * | 1/2020 | Huang | .................... H01L 28/60 |

\* cited by examiner

*Primary Examiner* — Jose R Diaz

(57) ABSTRACT

A system on a chip (SOC) device includes a substrate, processing circuitry formed on the substrate, and noise reduction circuitry formed on the processing circuitry. The noise reduction circuitry is configured to reduce noise caused by variations in current consumed by the processing circuitry. The noise reduction circuitry includes a decoupling capacitor, which includes (i) two or more first layers, (ii) one or more second layers interleaved between the first layers, (iii) dielectric layers formed between adjacent first and second layers and configured to electrically isolate between the adjacent first and second layers, (iv) a first contact, which is electrically connected to the first layers so as to form a first electrode of the decoupling capacitor, and (v) a second contact, which is electrically connected to the second layers so as to form a second electrode of the decoupling capacitor.

15 Claims, 5 Drawing Sheets

DECOUPLING CAPACITOR INTEGRATED IN SYSTEM ON CHIP (SOC) DEVICE

CROSS-REFERENCE TO RELATED APPLICATIONS

This application claims the benefit of U.S. Provisional Patent Application 62/879,789, filed Jul. 29, 2019, whose disclosure is incorporated herein by reference.

FIELD OF THE DISCLOSURE

The present disclosure relates generally to semiconductor devices, and particularly to methods and systems for integrating decoupling capacitors in system on a chip devices.

BACKGROUND

Devices implemented as a system on a chip (SOC) and other semiconductor devices, which are produced using state-of-the-art technology nodes, may be prone to noise due to temporal variations in the electrical current consumed by the device.

The description above is presented as a general overview of related art in this field and should not be construed as an admission that any of the information it contains constitutes prior art against the present patent application.

SUMMARY

An embodiment that is described herein provides a system on a chip (SOC) device, including a substrate, processing circuitry formed on the substrate, and noise reduction circuitry formed on the processing circuitry. The noise reduction circuitry is configured to reduce noise caused by variations in current consumed by the processing circuitry. The noise reduction circuitry includes a decoupling capacitor, which includes (i) two or more first layers, (ii) one or more second layers interleaved between the first layers, (iii) dielectric layers formed between adjacent first and second layers and configured to electrically isolate between the adjacent first and second layers, (iv) a first contact, which is electrically connected to the first layers so as to form a first electrode of the decoupling capacitor, and (v) a second contact, which is electrically connected to the second layers so as to form a second electrode of the decoupling capacitor.

In some embodiments, the layers of the decoupling capacitor are parallel to a surface of the substrate. In other embodiments, the SOC device includes an additional dielectric layer, which is formed between the processing circuitry and the decoupling capacitor and is configured to electrically insulate between the processing circuitry and the decoupling capacitor. In yet other embodiments, the additional dielectric layer has a first dielectric constant, smaller than a second dielectric constant of the dielectric layers.

In an embodiment, the SOC device includes one or more interconnects, which are formed between the processing circuitry and one or both of the first and second contacts, the one or more interconnects configured to electrically connect between the processing circuitry and the decoupling capacitor. In another embodiment, the dielectric layers have a dielectric constant greater than six. In yet another embodiment, at least one of the first and second layers include at least one of metal and electrically conductive ceramic.

There is additionally provided, in accordance with an embodiment that is described herein, a method for producing a system on a chip (SOC) device. A substrate is provided, processing circuitry is formed on the substrate, and noise reduction circuitry is formed on the processing circuitry. The noise reduction circuitry includes a decoupling capacitor formed by: (i) forming two or more first layers, (ii) forming one or more second layers interleaved between the first layers, (iii) forming dielectric layers between adjacent first and second layers, (iv) forming a first electrode of the decoupling capacitor, by electrically connecting a first contact to the first layers, and (v) forming a second electrode of the decoupling capacitor, by electrically connecting a second contact to the second layers.

There is additionally provided, in accordance with an embodiment that is described herein, a system on a chip (SOC) device, including a substrate, processing circuitry formed on the substrate, and noise reduction circuitry at least partially formed within the processing circuitry and the substrate. The noise reduction circuitry is configured to reduce noise caused by variations in current consumed by the processing circuitry. The noise reduction circuitry includes a decoupling capacitor formed at least partially within the substrate. The decoupling capacitor includes: (i) a cavity formed within the substrate, (ii) first and second electrode layers formed at least within the cavity, and (iii) a dielectric layer, formed at least within the cavity between the first and second electrode layers and configured to electrically isolate between the first and second electrode layers.

In some embodiments, the SOC device includes an additional dielectric layer formed between the substrate and the first electrode layer and configured to electrically isolate between the substrate and the first electrode layer. In other embodiments, the additional dielectric layer has a first dielectric constant, smaller than a second dielectric constant of the dielectric layer. In yet other embodiments, the SOC device includes a first contact, which is electrically connected to the first electrode layer so as to form a first electrode of the decoupling capacitor, and a second contact, which is electrically connected to the second electrode layer so as to form a second electrode of the decoupling capacitor.

There is additionally provided, in accordance with an embodiment that is described herein, a method for producing a system on a chip (SOC) device. A substrate is provided, processing circuitry is formed on the substrate, and noise reduction circuitry for reducing noise caused by variations in current consumed by the processing circuitry is produced, at least partially within the substrate. The noise reduction circuitry includes a decoupling capacitor produced by: (i) forming a cavity within the substrate, (ii) forming first and second electrode layers within the cavity, and (iii) forming a dielectric layer within the cavity between the first and second electrode layers.

The present disclosure will be more fully understood from the following detailed description of the embodiments thereof, taken together with the drawings in which:

DETAILED DESCRIPTION OF EMBODIMENTS

Figure 1:
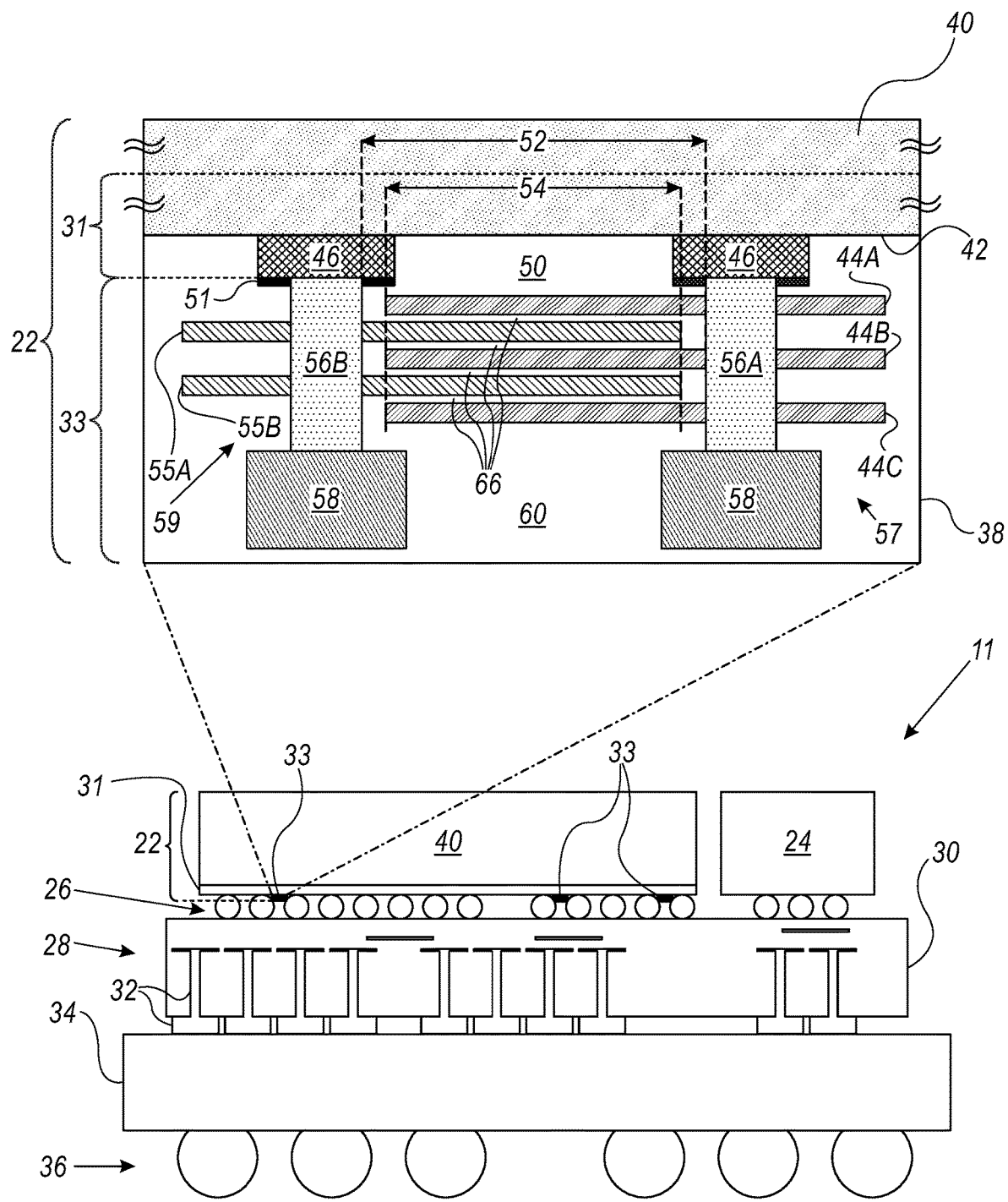
FIG. 1 is a schematic side view of a decoupling capacitor (Decap) integrated in a system on a chip (SOC) device, in accordance with an embodiment that is described herein.

Some semiconductor devices, such as a system on a chip (SOC), are prone to noise caused by temporal variations in the electrical current consumed by processing circuitry of the SOC.

Embodiments that are described herein provide techniques for reducing the noise by integrating one or more decoupling capacitors (Decaps) of noise reduction circuitry in the SOC. Such Decaps may be implemented, for example, in parallel to power supply rails of the SOC.

In some embodiments, the Decap may be integrated in the SOC by producing the Decap after the SOC formation, and electrically connecting the Decap with terminals, such as suitable electrical traces, of the SOC.

In some embodiments, the Decap comprises: (i) two or more first electrode layers, (ii) one or more second electrode layers interleaved between the first electrode layers, (iii) dielectric layers, which are formed between adjacent first and second electrode layers and are configured to electrically isolate between the adjacent first and second electrode layers, (iv) a first contact, which is electrically connected to the first electrode layers so as to form a first electrode of the Decap, and (v) a second contact, which is electrically connected to the second electrode layers so as to form a second electrode of the Decap.

In some embodiments, the Decap is electrically connected to the processing circuitry of the SOC by forming the first and second contacts electrically connected to first and second electrical traces of the SOC.

In alternative embodiments, one or more Decaps may be integrated in the SOC by forming the Decaps at least partially embedded in a substrate of the SOC. The Decap is at least partially embedded in the same substrate in which the processing circuitry of the SOC is disposed. In this configuration, the Decaps are typically formed before the production of the SOC. In such embodiments, the Decap comprises: (i) a cavity formed within a substrate of the SOC, (ii) a first dielectric layer formed at least within the cavity, (iii) first and second electrode layers formed at least within the cavity, and (iv) a dielectric layer, formed within the cavity between the first and second electrode layers and configured to electrically isolate between the first and second electrode layers.

In some embodiments, each of the at least partially embedded Decaps is integrated in the SOC by electrically connecting between the first and second electrode layers and first and second terminals of the SOC, respectively.

Example fabrication flows of both Decap configurations, and their integration in the SOC, are outlined herein.

In using the disclosed techniques, the performance of a SOC and other types of semiconductor devices improves by reducing the noise caused due to varying current consumed by such devices. It is possible in principle to place Decaps separately from the SOC, e.g., in an interposer substrate. Such a solution, however, is inferior because of the relatively long interconnections between the Decaps and the SOC, as will be explained below. Moreover, incorporating one or more Decaps within the SOC may increase fabrication flexibility and reduce the production cost of the some SOC devices, for example, by eliminating the interposer altogether.

The description above is presented as a general overview of embodiments of the present disclosure, which are described in detail herein.

FIG. 1 is a schematic side view of one or more decoupling capacitors (Decaps) 33 integrated in a system on a chip (SOC) 22 device of an electronic module 11, in accordance with an embodiment that is described herein. In some embodiments, electronic module 11 comprises SOC 22 and one or more memory devices, such as dynamic random access memory (DRAM) integrated in a stacked structure, referred to herein as High Bandwidth Memory (HBM) 24.

In some embodiments, SOC 22 comprises a substrate 40 and processing circuitry 31 having active structures disposed within and on substrate 40. For example, in a transistor, the diffusion and source/drain structures are typically formed within substrate 40, and the gate and metal interconnect structures are typically external to substrate 40 (e.g., formed on the outer surface of substrate 40). Both substrate 40 and processing circuitry 31 are further described below. In some embodiments described in more detail below, Decaps 33 are connected to the outermost layer of the aforementioned metal interconnect structures of processing circuitry 31, and therefore, are shown external to substrate 40 of SOC 22.

In some embodiments, electronic module 11 comprises an interposer 28, typically made from a semiconductor substrate 30, such as silicon, and having various types of electrical interconnections 32, such as but not limited to one or more through-silicon vias (TSVs), redistribution layers (RDL), pads and bumps. Electronic module 11 further comprises a substrate 34, which constitutes part of the packaging of electronic module 11, and is coupled to an electronic system (not shown) via packaging balls 36.

In some embodiments, electronic module 11 comprises electrically conductive bumps 26, which are configured to supply power to SOC 22 and HBM 24 and to exchange electrical signals between SOC 22, HBM 24 and interposer 28. Typically, the power supply and some of the electrical signals are conducted between the electronic system and SOC 22 via packaging balls 36, interposer 28 and bumps 26.

In some cases, the active structures (not shown) of processing circuitry 31, such as fin field effect transistors (finFETs), may have variations in power consumption over time, e.g., due to state switching. Such a varying current consumption from the power supply (not shown) may cause interfering noise in electronic module 11. Note that in the example of electronic module 11, at least SOC 22 is coupled to interposer 28 using flip-chip techniques, so that the active structures of SOC 22 are facing interposer 28. In other embodiments, SOC 22 may be coupled to interposer 28, or to any other substrate of electronic module 11, using any suitable technique other than flip-chip.

In some embodiments, Decaps 33 are coupled to power supply electrical traces, typically in parallel to the power source. The Decaps are configured to suppress the aforementioned noise caused due to the time-varying current consumed by processing circuitry 31 of SOC 22. In principle, it is possible to implement one or more Decaps 33 in interposer 28. Due to (i) the distance from SOC 22, and (ii) conducting the supply current and electrical signals through electrical interconnections 32 of interposer 28, however, additional impedance may result, which may cause additional undesirable noise and/or a voltage drop in electronic module 11.

Reference is now made to an inset 38 showing Decap 33 integrated in SOC 22, in accordance with an embodiment. In some embodiments, SOC 22 comprises substrate 40, typically made from silicon, or silicon-germanium, or any other suitable semiconductor material or compound. Active structures (not shown) of processing circuitry 31 are formed in close proximity to a surface 42 of SOC 22, and are interconnected by electrical traces, such as traces 46, so as to carry out the electronic functions of SOC 22. Note that SOC 22 typically comprises multiple layers of traces 46, typically implemented as metal layers formed on surface 42 of substrate 40, for interconnecting between the active structures of processing circuitry 31.

In some embodiments, the outer interconnecting layer of processing circuitry 31 of SOC 22, shown as trace 46, is configured to electrically connect between Decap 33 and processing circuitry 31 of SOC 22. Note that Decaps 33 are external to both substrate 40 and processing circuitry 31, because they are electrically connected with traces 46, which are the outer layer of processing circuitry 31 and are external to substrate 40.

In some embodiments, Decap 33 comprises a dielectric layer, in the present example a silicon dioxide ($SiO_2$) layer 50, which is configured to electrically insulate between processing circuitry 31 and Decap 33.

In some embodiments, Decap 33 comprises electrical contacts 56A and 56B, made from tungsten or any other suitable electrically conductive material, which are formed in openings in silicon dioxide layer 50. In some embodiments, a liner layer (not shown) made from titanium nitride (TiN) or any other suitable material, is formed on the surface of the opening before depositing the tungsten layer. The TiN liner is configured to cover the surface of the opening and to serve as a bonding layer between the tungsten and the wall of the opening formed silicon dioxide layer 50.

In an embodiment, an etch-stop layer 51 may be formed on the surface of trace 46, so as to protect trace 46 from undesired etching during the formation of electrical contacts 56A and 56B as described in FIG. 2 below.

In some embodiments, Decap 33 further comprises aluminum pads (APs) 58, configured to electrically connect between Decap 33 and bumps 26. APs 58 are patterned in a silicon dioxide layer 60 or any other suitable type of one or more dielectric layers. Note that in the configuration of Decap 33, contacts 56A and 56B are configured to electrically connect between APs 58 and traces 46.

In some embodiments, Decap 33 comprises two sets of electrode layers, referred to herein as layers 44A, 44B, 44C, 55A and 55B, which are interleaved with one another. In the present configuration, layers 44A, 44B and 44C, are all connected to contact 56A, so as to form a first electrode 57 of Decap 33, and layers 55A and 55B are interleaved between layers 44A, 44B and 44C of first electrode 57, and are connected to contact 56B, so as to form a second electrode 59 of Decap 33.

In some embodiments, the electrode layers (layers 44A, 44B, 44C, 55A and 55B) are formed parallel to one another, so as to serve together as electrodes of Decap 33. Moreover, the electrode layers of Decap 33 are typically, but not necessarily, parallel to surface 42 of processing circuitry 31. For example, the electrode layers of Decap 33 may be orthogonal to surface 42 or at any other suitable angle relative to surface 42.

In some embodiments, the electrode layers are made from titanium nitride (TiN) and have a uniform thickness selected from a thickness range between about 10 nm and 50 nm. In other embodiments, the electrode layers may have any other suitable thickness and are made from any other suitable one or more electrically conductive materials, such as but not limited to metal, metal alloy, or suitable conductive ceramic materials.

In some embodiments, Decap 33 comprises high-k dielectric layers (HKDLs) 66 formed between adjacent electrode layers of electrodes 57 and 59, and are configured to electrically isolate between the adjacent electrode layers of electrodes 57 and 59. In the context of the present disclosure and in the claims, the term "high-k dielectric" refers to dielectric material or compound having a dielectric constant (k) greater than 6. For example, layer 50 may comprise silicon dioxide having a dielectric constant of about 3.9, whereas HKDL 66 is made from hafnium oxide ($HfO_2$), or zirconium oxide ($ZrO_2$), or hafnium zirconium oxide, having a dielectric constant of about 25 or any other suitable HKDL, having dielectric constant (k) greater than 6. In other embodiments, HDKL 66 may have any other suitable dielectric constant (k).

In the context of the present disclosure and in the claims, the terms "about" or "approximately" for any numerical values or range of numerical values, indicate a suitable dimensional tolerance that allows the part or collection of components, or a physical parameters such as thickness, or a physical constant, to function for its intended purpose as described herein.

In the present example, HKDLs 66 are disposed between layers 44A and 55A, between layers 55A and 44B, between layers 44B and 55B, and between layers 55B and 44C. Note that a distance 52 between contacts 56A and 56B is larger than an overlap 54 between the electrode layers, so that layers 44A, 44B and 44C are disconnected from contact 56B and layers 55A and 55B are disconnected from contact 56A.

In this configuration, the surface area of each electrode comprises a sum of the surface area of the respective electrode layers and a surface area of the respective contact between the electrode layers of the respective electrode. For example, the surface area of the first electrode comprises: (i) a sum of the surface area of electrode layers 44A, 44B and 44C, and (ii) the surface area of sections of contact 56A located between electrode layers 44A, 44B and 44C. Similarly, the surface area of the second electrode comprises: (i) a sum of the surface area of electrode layers 55A, 55B and 55C, and (ii) the surface area of sections of contact 56B located between electrode layers 55A, 55B and 55C.

In some embodiments, the high dielectric constant material of HKDL 66, allows using a relatively low thickness (e.g., between about 1 nm and 5 nm) of HKDL 66, which is the distance between adjacent electrode layers, without having tunneling effect caused by an electrical breakdown between two adjacent electrode layers of HDKL 66.

Note that the capacitance of Decap 33 depends on the total surface area of electrodes 57 and 59, and on the distance between adjacent electrode layers of electrodes 57 and 59. The capacitance of Decap 33 increases with increasing the surface area and decreasing the inter-electrode distance. Therefore, the configuration of Decap 33 enables large capacitance (e.g., greater than 50 $fF/\mu m^2$) achieved over a small footprint (e.g., between about 0.2 $\mu m^2$ and 100 $\mu m^2$) of Decap 33. In general, the capacitance (C) and resistance (R) of an RC circuit determine the RC time constant, which is indicative of the charging and discharging response time of the RC circuit. In some embodiments, the resistance that results by integrating Decap 33 in SOC 22, is smaller than the resistance when Decap 33 is positioned externally, which improves the charging/discharging response time, while retaining high capacitance value of Decap 33.

In some embodiments, the specified capacitance, footprint and response time of Decap 33, are used to determine the number of electrode layers, the inter-electrode distance and the materials selected for HKDL 66 and the electrode layers. For example, lower capacitance requirement may result in eliminating layers 44C and 55B from the present structure of Decap 33. In the present example, Decap 33 may have a capacitance density larger than 50 fF/µm².

This particular configuration of Decap 33 and the integration thereof in SOC 22, are shown by way of example, in order to illustrate certain problems that are addressed by disclosed embodiments and to demonstrate the application of these embodiments in enhancing the performance of SOC 22 and electrical module 11. The disclosed techniques, however, are by no means limited to this specific sort of example devices and module, and the principles described herein may similarly be applied to other sorts of electronic devices and modules. In other embodiments, Decap 33 may comprise any suitable number of electrode layers, made from any suitable materials, having any suitable thickness and inter-electrode distance, and arranged using any suitable geometrical configuration. For example, instead of a flat shape, the layers of Decap 33 may be arranged in a wavy or round shape.

Figure 2:
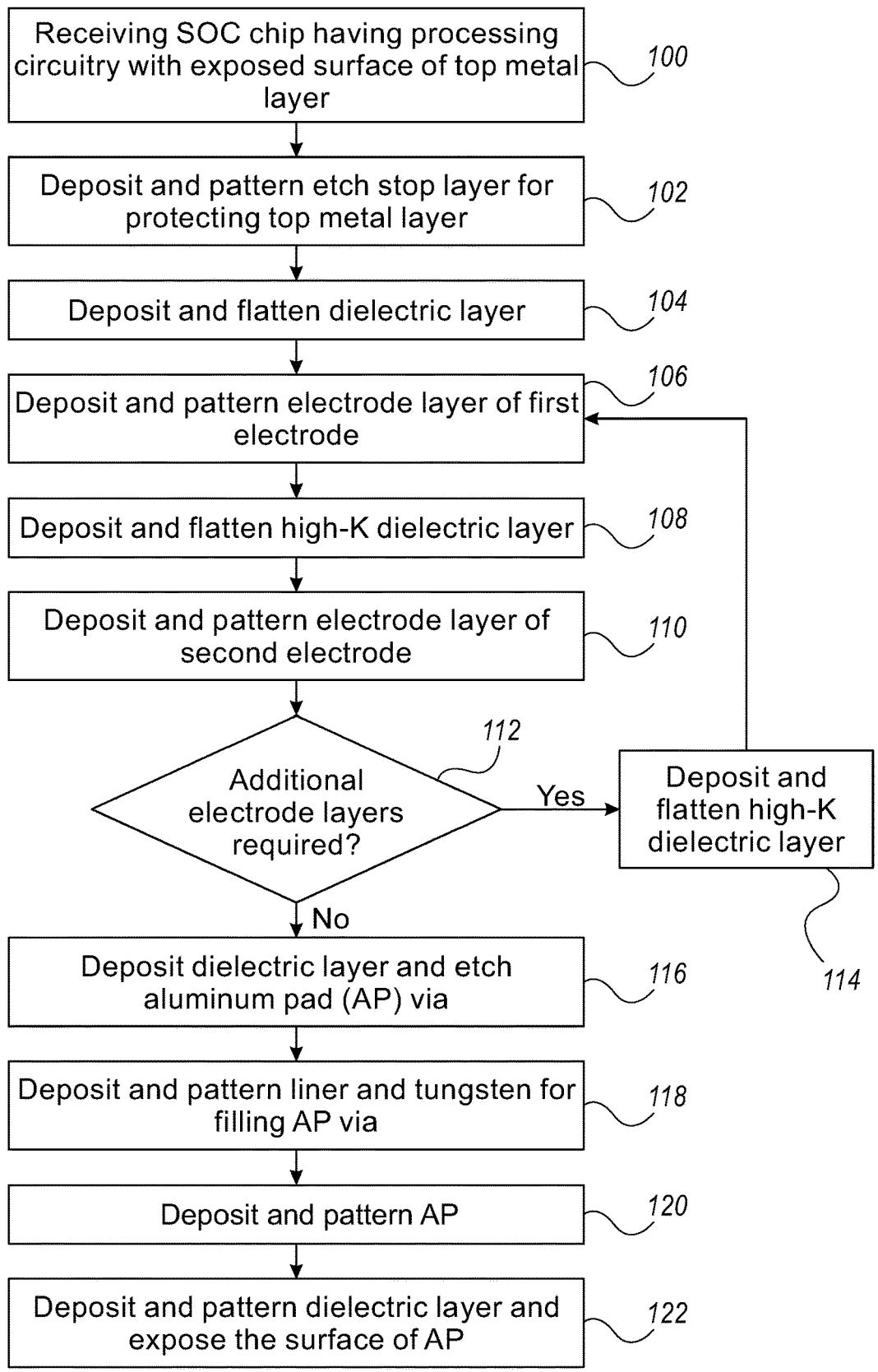
FIG. 2 is a flow chart that schematically illustrates a method for integrating a Decap in a SOC device, in accordance with an embodiment that is described herein.

FIG. 2 is a flow chart that schematically illustrates a method for integrating Decap 33 in SOC 22, in accordance with an embodiment that is described herein.

At the following operations, the method applies any suitable Complementary Metal Oxide Semiconductor (CMOS) processes, such as but not limited to: (a) thin-film (TF) deposition using chemical vapor deposition (CVD), metalorganic CVD (MOCVD), physical vapor deposition (PVD) also referred to herein as sputtering, electroplating (EP) and electrochemical plating (ECP) and atomic layer deposition (ALD), (b) various types of reactive-ion etching (RIE), wet etching, and other types of etching processes, (c) photoresist (PR)-based photolithography, (d) polishing and planarization processes, such as chemical mechanical polishing (CMP) or applying polyimide and spinning for obtaining planar surfaces, or selective etch-back processes, and (e) various processes of mask removal, such as but not limited to photoresist asking, photoresist stripping and hardmask etching.

The method begins at an operation 100 with receiving processing circuitry 31 of SOC 22 formed with exposed surface of top metal layer, also referred to herein and shown as trace 46 of FIG. 1 above. Note that at operation 100, processing circuitry 31 of SOC 22 is already produced so that the method below describes the integration of Decap 33 in SOC 22 by producing Decap 33 connected to the top metal layer (e.g., traces 46) of processing circuitry 31.

At an operation 102, etch-stop layer 51 is deposited and patterned over the surface of trace 46. Note that etch-stop layer 51 is configured to protect trace 46 (which is the top metal layer of processing circuitry 31) from over-etching during etching processes described below. In the present example, etch-stop layer 51 may comprise silicon-nitride ($Si_3N_4$) or any suitable type of hard mask layer configured to protect the top metal layer of SOC 22. At an operation 104, silicon dioxide layer 50 is deposited over surface 42 and etch-stop layer 51, and flattened so that the surface of silicon dioxide layer 50 and surface 42 are parallel to one another.

At an operation 106, electrode layer 44A, which is the first electrode layer of electrode 57 and is made from TiN, is deposited over silicon dioxide layer 50 and patterned, as shown in FIG. 1 above. Note that layer 44A is typically parallel to surface 42 of processing circuitry 31 of SOC 22, but in other embodiments, the entire stack of Decap 33 (e.g., the electrode layers and HKDLs 66, which are parallel to one another), may be produced at an orientation other than parallel to surface 42. At an operation 108, HKDL 66 is deposited over the exposed surface of layers 44A and 50, and is polished (e.g., using a CMP process) so as to have a flat surface thereof, which is parallel to layer 44A. At an operation 110, TiN electrode layer 55A is deposited over HKDL 66, and patterned so as to form the first electrode layer of electrode 59, as shown in FIG. 1 above. Note that layers 44A and 55A are formed parallel to one another so as to generate the capacitor structure of Decap 33.

At a decision operation 112, the method includes a decision of whether or not additional electrode layers are required. In case additional electrode layers are required, the method proceeds to an operation 114 with depositing and flattening HKDL 66 over layer 55A using the process described in operation 108 above, and subsequently the method loops back to operation 106.

In the example of FIG. 1 above, layers 44B and 44C are formed by repeating operation 106 twice, three HKDLs 66 are formed by repeating operation 108 twice and operation 114 once, and layer 55B is formed by repeating operation 110 once. Note that in such embodiments, an additional decision operation, similar to operation 112, may be required in the method after operation 106, so as to produce uneven number of electrode layers in electrodes 57 and 59 (e.g., three layers 44 in electrode 57 and two layers 55 in electrode 59).

In some embodiments, electrode layers 44A, 44B and 44C are designed to have an identical pattern, therefore, during operation 106 a common first lithography mask may be used for producing the pattern of electrode layers 44A, 44B and 44C. Similarly, during operation 110 a common second lithography mask may be used for producing the pattern of electrode layers 55A and 55B, and during operation 108, a common third lithography mask may be used for producing the pattern of HKDLs 66. Note that when producing the example configuration of FIG. 1 above, the first, second and third lithography masks are used alternately for producing, respectively, the interleaved first electrode layers (in operation 106) HDKLs 66 (in operation 108) and second electrode layers (in operation 110).

In case no additional electrode layers are required, the method proceeds to an operation 116 with depositing silicon dioxide layer 60 over the last electrode layer (e.g., layer 44C of FIG. 1 above) and optionally flattening silicon dioxide layer 60 using CMP or another suitable process. Subsequently, aluminum pad (AP) vias, also referred to herein as contacts 56A and 56B, are formed by etching silicon dioxide layer 60 until reaching etch-stop layer 51. Note that etch-stop layer 51 is configured to protect trace 46 from undesired etching during the etching process of contacts 56A and 56B. Typically, etch-stop layer 51 is etched so as to expose the surface of trace 46.

In some embodiments, at an operation 118, the aforementioned TiN liner and tungsten layers are deposited sequentially over the pattern of silicon dioxide layer 60, and subsequently, the TiN liner and tungsten layers are patterned for filling contacts 56A and 56B without leaving residues thereof on the surface of silicon dioxide layer 60. At an operation 120, aluminum pads (APs) 58 are deposited over the surface of silicon dioxide layer 60, and are patterned such that each contact 56A and 56B is electrically connected to a corresponding AP 58.

In other embodiments, at an operation 122 that concludes the method, an additional dielectric layer (not shown) such as silicon dioxide layer 60, is deposited at least over silicon dioxide layer 60, and patterned so as to retain the surface of APs 58 exposed for being electrically connected to bumps 26 and/or RDLs of interposer 28, described in FIG. 1 above.

In other embodiments, instead of operations 118, 120 and 122 described above, multiple trenches having the dimensions (width and depth) of APs 58 are patterned in silicon dioxide layer 60. Subsequently, APs 58 may be deposited into the trenches, and recessed (e.g., using CMP and/or etch-back processes) so as to be flush with the surface of silicon dioxide layer 60.

The process flow of FIG. 2 is simplified for the sake of conceptual clarity, and some of the operations described above may be carried out using any other suitable techniques of CMOS processes or any other suitable processing techniques. Moreover, the operations described above may be carried out in a different order. For example, the formation of contacts 56A and 56B and APs 58 may be carried out using a dual damascene process in which holes intended for contacts 56A and 56B and trenches intended for APs 58 may be etched in silicon dioxide layer 60, and subsequently, the holes and trenches may be filled with any suitable type of one or more electrically-conductive layers.

Figure 3:
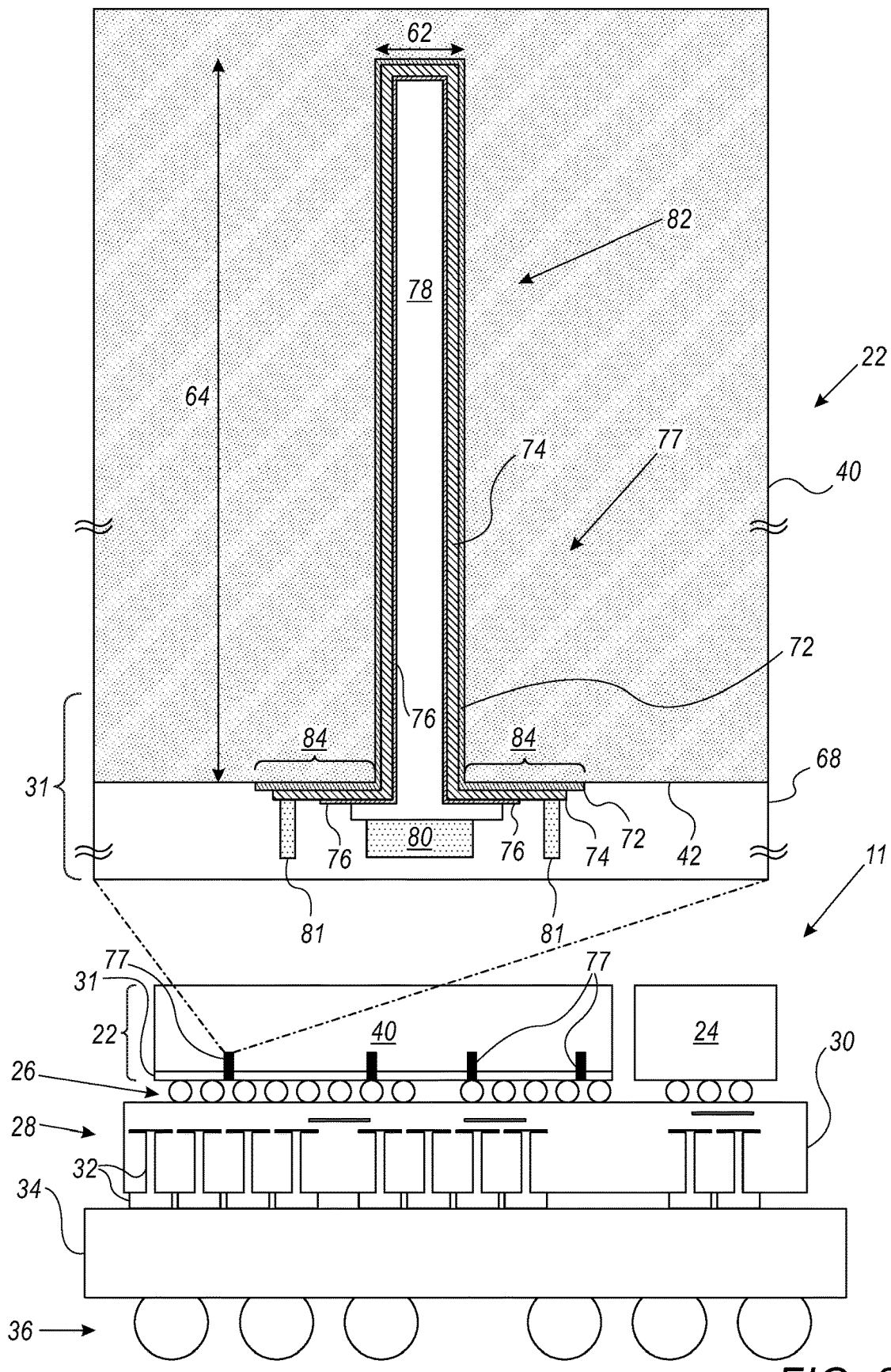
FIG. 3 is a schematic side view of a Decap formed within a substrate of a SOC device, in accordance with another embodiment that is described herein.

FIG. 3 is a schematic side view of a Decap 77 at least partially embedded within substrate 40 of SOC 22, in accordance with another embodiment that is described herein. In some embodiments, electronic module 11 of FIG. 3 is similar to that of FIG. 1 except for replacing Decap 33 with Decap 77. Note that Decap 33 is produced after concluding the production of SOC 22, whereas Decap 77 is: (i) produced before starting the CMOS processes of processing circuitry 31 of SOC 22, (ii) embedded in substrate 40 of SOC 22, and (iii) electrically connected to bumps 26 via metal interconnects of processing circuitry 31 of SOC 22. As described in FIG. 1 above, processing circuitry 31 comprises, inter alia, structures (not shown) embedded within substrate 40 and layers (e.g., electrical traces 81 and 80 described below) external to substrate 40.

Reference is now made to an inset 68 showing Decap 77 integrated in SOC 22, in accordance with an embodiment. In some embodiments, Decap 77 comprises a cavity 82 formed within substrate 40 of SOC 22. Note that cavity 82 may have any suitable shape (in top view), such as but not limited to a round hole, an oval hole, a rectangular trench, a rounded trench, or a square hole.

In the present example, cavity 82 has a typical depth 64 of about 10 μm and a typical width 62 of about 1 μm. In such embodiments, cavity 82 has an aspect ratio (AR), defined as depth 64 divided by width 62, of about 10. In other embodiments, cavity 82 may have any other suitable depth 64 between about 1 μm and 100 μm, and width 62 between about 100 nm and 10 μm.

Note that depth 64 and width 62 are defined based on the specified capacitance, footprint and response time of Decap 77. Moreover, depth 64 and width 62 are also defined based on the processing constraints. For example, (i) etching a cavity deeper than 10 μm may require a long processing time, and (ii) filling cavity 82 having AR greater than 10 with multiple layers may result in insufficient yield and/or may be prone to quality and reliability degradation, such as delamination of one or more layers of Decap 77 or bubble formation during the filling of cavity 82.

In some embodiments, Decap 77 comprises a dielectric layer 72, such as silicon dioxide having a thickness between about 5 nm and 10 nm, which is configured to electrically insulate between substrate 40 and a capacitor (described herein) of Decap 77. In other words, Decap 77 comprises an electrically floating capacitor.

In an embodiment shown in FIG. 3, dielectric layer 72 is formed within cavity 82 and over a section 84 surrounding cavity 82.

In some embodiments, Decap 77 comprises an electrode layer 74, which is formed over dielectric layer 72. Electrode layer 74 is typically made from TiN or from any other suitable electrically conductive layer, and having a thickness between about 10 nm and 50 nm. Electrode layer 74 is configured to serve as an electrode of Decap 77. Note that dielectric layer 72 electrically insulates between substrate 40 and electrode layer 74, also within section 84, so as to retain Decap 77 as an electrically floating capacitor.

In some embodiments, Decap 77 comprises a HKDL 76, which is similar to HKDL 66 of FIG. 1 above (e.g., made from hafnium-oxide or any other material having a dielectric constant greater than 6) and is formed over electrode layer 74. HKDL 76 is configured to serve as an inter-electrode dielectric of Decap 77 and having a thickness between about 1 nm and 5 nm. Note that electrode layer 74 also serves as a buffer between dielectric layer 72 and HKDL 76 (also in section 84), so as to retain the capacitor structure of Decap 77.

In some embodiments, Decap 77 comprises an electrode layer 78, which is formed over HKDL 76. Electrode layer 74 is made from any electrically conductive material, which is configured to serve as an electrode of Decap 77 and to fill cavity 82. Note that layers 72, 74, 76 and 78 are all covering the surface of cavity 82, and are patterned over section 84 of surface 42 so as to connect electrode layers 74 and 78 to electrical traces 81 and 80, respectively. Moreover, dielectric layer 72 and HKDL 76 are patterned so as to electrically insulate between substrate 40 and the electrode layers, and between electrode layers 74 and 78, so as to retain Decap 77 as an electrically floating capacitor.

In some embodiments, electrical traces 81 and 80 may comprise any suitable conductive layer of SOC 22, such as gate layer, contact layer, or first metal layer. Electrical traces 81 and 80 are configured to charge and discharge Decap 77 so as to reduce noise in the presence of varying current consumption of SOC 22.

Note that by having a floating capacitor within cavity 82, a single Decap 77 is configured to carry out the aforementioned noise reduction. The operation of Decap 77 is controlled by the voltage supplied to electrode layers 74 and 78 by electrical traces 81 and 80, respectively.

As described in FIG. 1 above, the capacitance of Decap 77 depends on the total surface area of electrode layers 74 and 78, and on the distance therebetween. In some embodiments, the high AR (e.g., about 10) of cavity 82 that enables large (e.g., between about 0.2 μm$^2$ and 2000 μm$^2$) surface area of electrode layers 74 and 78, and the use of high-k dielectric materials that enables a small (e.g., between about 1 nm and 5 nm) distance between electrode layers 74 and 78, enables the formation of a high density capacitor. In the present example, Decap 77 may have a capacitance density larger than 100 fF/μm$^2$.

This particular configuration of Decap 77 and the integration thereof in SOC 22, are shown by way of example, in order to illustrate certain problems that are addressed by disclosed embodiments and to demonstrate the application of these embodiments in enhancing the performance of SOC 22 and electrical module 11. The disclosed techniques, however, are by no means limited to this specific sort of example devices and module, and the principles described herein may similarly be applied to other sorts of electronic devices and modules.

Figure 4:
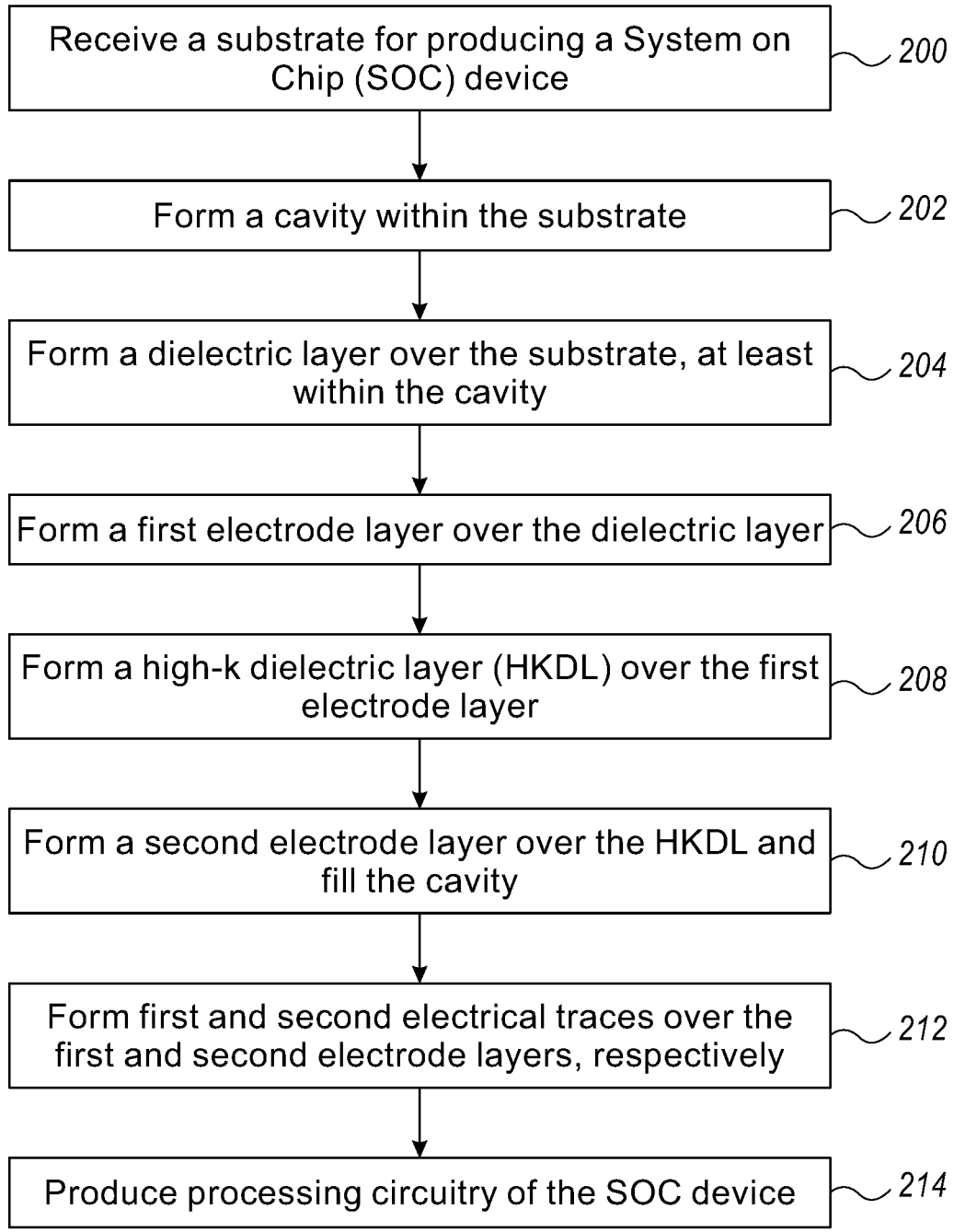
FIG. 4 is a flow chart that schematically illustrates a method for producing a Decap at least partially within a substrate of a SOC device, in accordance with another embodiment that is described herein.

FIG. 4 is a flow chart that schematically illustrates a method for producing Decap 77 at least partially embedded within substrate 40 of SOC 22, in accordance with another embodiment that is described herein. At the following operations, the method applies any suitable CMOS processes, such as the processes described in FIG. 2 above.

The method begins at an operation 200 with receiving substrate 40 intended for producing SOC 22, note that at operation 200, SOC 22 is not yet produced over substrate 40. At an operation 202, cavity 82 is formed by etching into substrate 40 a geometrical structure having depth 64 and width 62 as described in FIG. 3 above. Note that for the sake of conceptual clarity, FIG. 4 described the formation of one Decap 77, but the embodiments described herein are applicable for producing any suitable number of Decaps 77.

At an operation 204, dielectric layer 72 is deposited over surface 42 of substrate 40 and patterned so that dielectric layer 72 remains within cavity 82 and within section 84 surrounding cavity 82. Note that in the following description of the process flow for producing Decap 77, surface 42 does not have yet any structures of SOC 22. At an operation 206, electrode layer 74, which is made from a TiN layer having a thickness of about 10 nm, is formed over dielectric layer 72. Note that electrode layer 74 is not formed over any section of substrate 40, and therefore, dielectric layer 72 is electrically insulating between electrode layer 74 and substrate 40.

At an operation 208, HKDL 76 is formed over electrode layer 74. Note that electrode layer 74 also serves as a buffer between dielectric layer 72 and HKDL 76 (also in section 84), so as to retain the capacitor structure of Decap 77. At an operation 210, electrode layer 78, which is made from TiN or another suitable electrically conductive material, is formed over HKDL 76, and typically but not necessarily, may be used for filling cavity 82. In other embodiments, an additional conductive layer (not shown), which is more suitable for filling cavity 82, may formed over electrode layer 78 so as to reduce the cost of filling cavity 82. For example, in case electrode layer 78 is made from TiN, an aluminum layer may be formed over electrode layer 78, e.g., using a PVD process, which may be faster and less expensive than filling the entire cavity with TiN. Note that electrode layer 78 is not formed over any section of substrate 40 (insulated by dielectric layer 72) or over electrode layer 74 (insulated by HKDL 76), so as to retain the floating capacitor structure of Decap 77.

Note that operation 210 typically concludes the formation of Decap 77, and at an operation 212, electrical traces 81 and 80 are formed over electrode layers 74 and 78, respectively, so as to serve as terminals for charging and discharging Decap 77.

At an operation 214 that concludes the method, processing circuitry 31 of SOC 22 is produced using suitable CMOS processes, such that Decap 77 is integrated in SOC 22 by electrically connecting electrical traces 81 and 80 to suitable elements (e.g., power supply traces) of SOC 22.

The process flow of FIG. 4 is simplified for the sake of conceptual clarity, and some of the operations described above may be carried out using any other sorts of CMOS processes or any other suitable processing techniques.

Figure 5A:
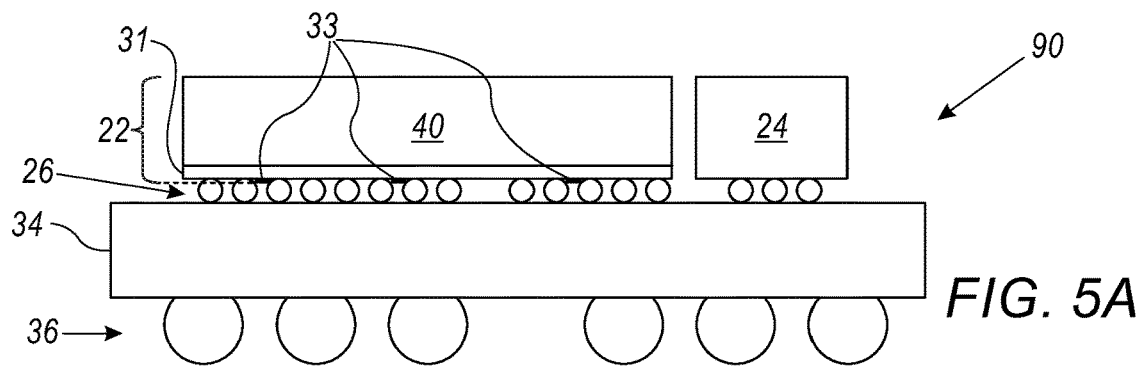
FIGS. 5A and 5B are schematic side views of multi-chip-modules (MCMs) comprising SOC with integrated Decaps and High Bandwidth Memory (HBM), in accordance with other embodiments that are described herein.

FIG. 5A is a schematic side view of a multi-chip-module (MCM) 90 comprising SOC 22 with integrated Decaps 33 and HBM 24, in accordance with another embodiment that is described herein. In some embodiments, MCM 90 comprises the same components of electronic module 11 shown in FIG. 1 above, excluding interposer 28. In such embodiments, SOC 22 and HBM 24 are coupled to bumps 26, or to any other suitable type of bumps, and bumps 26 are coupled directly to substrate 34. Note that integrating Decaps 33 in SOC 22 may reduce the need for having an interposer in the package of MCM 90, and therefore, may increase the flexibility and reduce the cost of packaging MCM 90 while retaining functionality similar to that of electronic module 11.

Figure 5B:
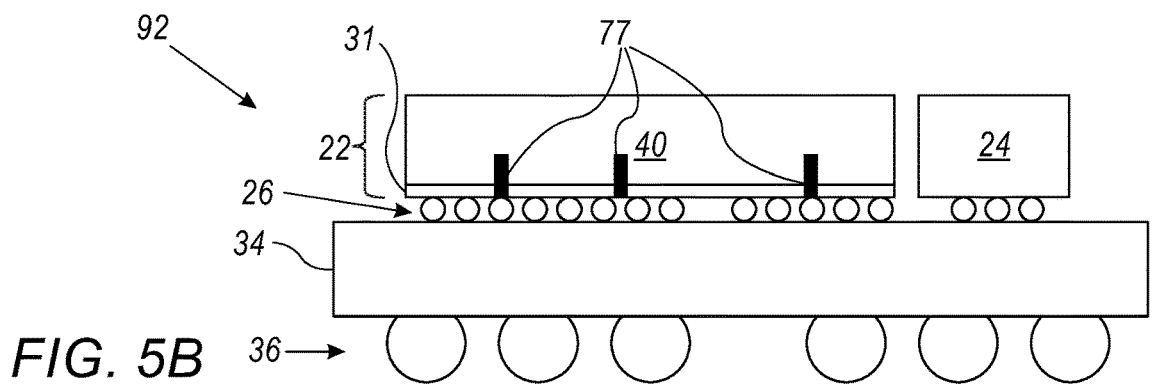

FIG. 5B is a schematic side view of a MCM 92 comprising SOC 22 with integrated Decaps 77 and HBM 24, in accordance with another embodiment that is described herein. In some embodiments, MCM 92 comprises the same components of electronic module 11 shown in FIG. 3 above, excluding interposer 28. In such embodiments, SOC 22 and HBM 24 are coupled to bumps 26, or to any other suitable type of bumps, and bumps 26 are coupled directly to substrate 34. Note that integrating Decaps 77 in SOC 22 may reduce the need for having an interposer in the package of MCM 92, and therefore, may increase the flexibility and reduce the cost of packaging MCM 92 while retaining functionality similar to that of electronic module 11.

Figure 6A:
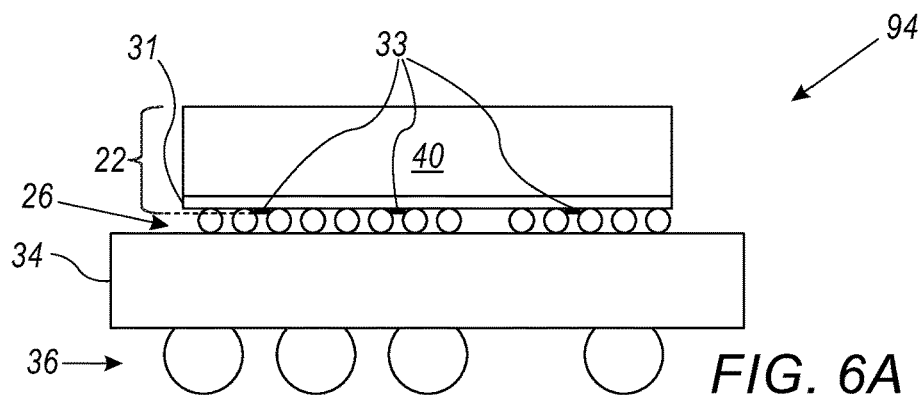
FIGS. 6A and 6B are schematic side views of packaged SOCs having integrated Decaps, in accordance with other embodiments that are described herein.

FIG. 6A is a schematic side view of a package 94 of SOC 22 with integrated Decaps 33, in accordance with another embodiment that is described herein. In some embodiments, package 94 comprises the same components of MCM 90 shown in FIG. 5A above, excluding HBM 24. Note that integrating Decaps 33 in SOC 22 may reduce the need for having an interposer, such as interposer 28 of FIG. 1 above, in package 94, and therefore, may increase the flexibility and reduce the cost of packaging SOC 22.

Figure 6B:
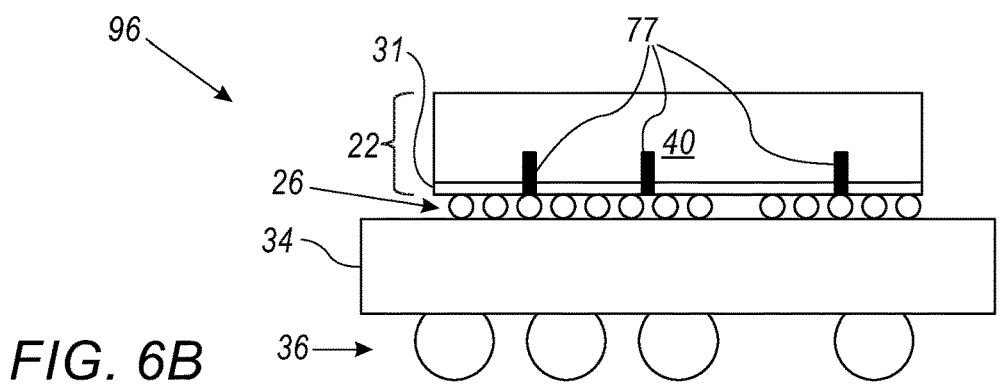

FIG. 6B is a schematic side view of a package 96 of SOC 22 with integrated Decaps 77, in accordance with another embodiment that is described herein. In some embodiments, package 96 comprises the same components of MCM 92 shown in FIG. 5B above, excluding HBM 24. Note that integrating Decaps 77 in SOC 22 may reduce the need for having an interposer, such as interposer 28 of FIG. 3 above, in package 96, and therefore, may increase the flexibility and reduce the cost of packaging SOC 22.

Although the embodiments described herein mainly address decoupling capacitors integrated in system on a chip devices, the methods and devices described herein can also be used in other applications, such as in any suitable type of semiconductor device.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A system on a chip (SOC) device, comprising:
  a substrate;

processing circuitry, formed on the substrate and having multiple bumps disposed thereon; and noise reduction circuitry formed on an outer surface of the processing circuitry between two of the bumps, the noise reduction circuitry configured to reduce noise caused by—variations in current consumed by the processing circuitry, the noise reduction circuitry including a decoupling capacitor, comprising:

two or more first layers;

one or more second layers interleaved between the first layers;

dielectric layers formed between adjacent first Sand second layers and configured to electrically isolate between the adjacent first and second layers; a first contact, which is electrically connected to the first layers so as to form a first electrode of the decoupling capacitor; and a second contact, which is electrically connected to the second layers so as to form a second electrode of the decoupling capacitor.

2. The SOC device according to claim 1, wherein the layers of the decoupling capacitor are parallel to a surface of the substrate.

3. The SOC device according to claim 1, comprising an additional dielectric layer, which is formed between the processing circuitry and the decoupling capacitor and is configured to electrically insulate between the processing circuitry and the decoupling capacitor.

4. The SOC device according to claim 3, wherein the additional dielectric layer has a first dielectric constant, smaller than a second dielectric constant of the dielectric layers.

5. The SOC device according to claim 1, comprising one or more interconnects, which are formed between the processing circuitry and one or both of the first and second contacts, the one or more interconnects configured to electrically connect between the processing circuitry and the decoupling capacitor.

6. The SOC device according to claim 1, wherein the dielectric layers have a dielectric constant greater than six.

7. The SOC device according to claim 1, wherein at least one of the first and second layers comprise at least one of metal and electrically conductive ceramic.

8. A method for producing a system on a chip (SOC) device, the method comprising:

providing a substrate;

forming, on the substrate, processing circuitry and multiple bumps disposed on an outer surface of the processing circuitry; and forming, between two of the bumps, on the outer surface of the processing circuitry, noise reduction circuitry including a decoupling capacitor formed by:

forming two or more first layers;

forming one or more second layers interleaved between the first layers;

forming dielectric layers between adjacent first and second layers;

forming a first electrode of the decoupling capacitor, by electrically connecting a first contact to the first layers; and forming a second electrode of the decoupling capacitor, by electrically connecting a second contact to the second layers.

9. The method according to claim 8, wherein producing the decoupling capacitor comprises forming the first and second layers parallel to the substrate.

10. The method according to claim 8, comprising forming an additional dielectric layer between the processing circuitry and the decoupling capacitor.

11. The method according to claim 10, wherein forming the additional dielectric layer comprises forming the additional dielectric layer with a first dielectric constant smaller than a second dielectric constant of the one or more dielectric layers.

12. The method according to claim 8, comprising forming one or more interconnects between the processing circuitry and one or both of the first and second contacts.

13. The method according to claim 8, wherein forming the dielectric layers comprises depositing a dielectric layer having a dielectric constant greater than six.

14. The method according to claim 8, wherein forming at least one of the first and second layers comprise depositing at least one of metal and electrically conductive ceramic.

15. The method according to claim 8, wherein forming the first layers, the second layers, and the dielectric layers comprise alternately applying respective first, second and third lithography masks.

\* \* \* \* \*